United States Patent
Rondinelli et al.

(10) Patent No.: US 10,186,595 B2
(45) Date of Patent: Jan. 22, 2019

(54) NONCENTROSYMMETRIC METAL ELECTRODES FOR FERROIC DEVICES

(71) Applicant: Northwestern University, Evanston, IL (US)

(72) Inventors: James M. Rondinelli, Chicago, IL (US); Danilo Puggioni, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/666,856

(22) Filed: Aug. 2, 2017

(65) Prior Publication Data

US 2018/0040711 A1 Feb. 8, 2018

Related U.S. Application Data

(60) Provisional application No. 62/371,345, filed on Aug. 5, 2016.

(51) Int. Cl.
| | |
|---|---|
| *H01L 29/51* | (2006.01) |
| *H01L 29/49* | (2006.01) |
| *H01L 29/78* | (2006.01) |
| *H01L 49/02* | (2006.01) |
| *H01L 29/24* | (2006.01) |

(52) U.S. Cl.
CPC ............ *H01L 29/516* (2013.01); *H01L 28/55* (2013.01); *H01L 28/56* (2013.01); *H01L 29/24* (2013.01); *H01L 29/4966* (2013.01); *H01L 29/513* (2013.01); *H01L 29/517* (2013.01); *H01L 29/78391* (2014.09)

(58) Field of Classification Search
CPC ............ H01L 29/516; H01L 29/78391; H01L 29/4966; H01L 29/513; H01L 29/517
See application file for complete search history.

(56) References Cited

U.S. PATENT DOCUMENTS

| | | |
|---|---|---|
| 4,893,272 A | 1/1990 | Eaton, Jr. et al. |
| 5,005,102 A | 4/1991 | Larson |
| 5,479,317 A | 12/1995 | Ramesh |
| 5,798,903 A | 8/1998 | Dhote et al. |
| 6,893,912 B2 | 5/2005 | Lung |

(Continued)

OTHER PUBLICATIONS

Yamada et al., Strong Surface-Termination Effect on Electroresistance in Ferroelectric Tunnel Junctions, Adv. Funct. Mater. 25, Mar. 24, 2015, pp. 2708-2714.

(Continued)

*Primary Examiner* — Christine Enad
(74) *Attorney, Agent, or Firm* — Bell & Manning, LLC

(57) ABSTRACT

A ferroelectric heterostructure may comprise a ferroelectric layer comprising a ferroelectric material and a first electrode layer comprising a first noncentrosymmetric metal, the first electrode layer disposed on the ferroelectric layer to form a ferroelectric-first electrode interface, wherein the ferroelectric layer is characterized by exhibiting an electric polarization and the first electrode layer is characterized by exhibiting polar ionic displacements and further wherein, a component of the polar ionic displacements of the first electrode layer is parallel to a component of the electric polarization of the ferroelectric layer.

20 Claims, 10 Drawing Sheets

(56) References Cited

U.S. PATENT DOCUMENTS

| | | | | |
|---|---|---|---|---|
| 6,960,539 | B2* | 11/2005 | Higuchi | H01L 21/31691 257/410 |
| 7,646,073 | B2 | 1/2010 | Hamada | |
| 2003/0062553 | A1* | 4/2003 | Ramesh | G11C 11/22 257/295 |
| 2008/0121953 | A1* | 5/2008 | Summerfelt | H01L 27/11502 257/295 |
| 2009/0280355 | A1* | 11/2009 | Eom | C30B 23/02 428/701 |
| 2015/0144588 | A1* | 5/2015 | Ihlefeld | C09K 13/00 216/12 |

OTHER PUBLICATIONS

Shi et al., A ferroelectric-like structural transition in a metal, Sep. 2013.

Kim et al., Polar metals by geometric design, Nature, vol. 533, Apr. 20, 2016, pp. 68-72.

V. Edelstein, Features of light reflection off metals with destroyed mirror symmetry, Physical Review B 83, Mar. 31, 2011, pp. 113109-1-113109-4.

V. Edelstein, Magnetoelectric Effect in Polar Superconductors, Physical Review Letters, vol. 75, No. 10, Sep. 4, 1995, pp. 2004-2007.

Ali et al., Noncentrosymmetric superconductor with a bulk three-dimensional Dirac cone gapped by strong spin-orbit coupling, Physical Review B 89, Jan. 14, 2014, pp. 020505-1-020505-5.

Mühlbauer et al., Skyrmion Lattice in a Chiral Magnet, Science, vol. 323, Feb. 13, 2009, pp. 915-919.

Frigeri et al., Superconductivity without Inversion Symmetry: MnSi versus CePt3Si, Physical Review Letters, vol. 92, No. 9, Mar. 5, 2004, pp. 097001-1-097001-4.

Puggioni et al., Designing a robustly metallic noncenstrosymmetric ruthenate oxide with large thermopower anisotropy, Nature Communications | 5:3432, Mar. 17, 2014.

Benedek et al., 'Ferroelectric' metals reexamined: fundamental mechanisms and design considerations for new materials, J. Mater. Chem. C, 4, Jan. 18, 2016, pp. 4000-4015.

Cai et al., Vanishing critical thickness in asymmetric ferroelectric tunnel junctions: First principle simulations, J. Appl. Phys. 109, Jan. 19, 2011, pp. 024103-1-024103-6.

Chang et al., Settling the "Dead Layer" Debate in Nanoscale Capacitors, Adv. Mater., 21, Aug. 15, 2009, pp. 4911-4914.

Junquera et al., Critical thickness for ferroelectricity in perovskite ultrathin films, Nature, vol. 422, Apr. 3, 2003, pp. 506-509.

Kim et al., Polarization Relaxation Induced by Depolarization Field in Ultrathin Ferroelectric BaTiO3 Capacitors, arXiv:cond-mat/0506480v2, Oct. 14, 2005.

Lee et al., Emergence of room-temperature ferroelectricity at reduced dimensions, Science, vol. 349, issue 6254, Sep. 18, 2015, pp. 1314-1317.

Lu et al., Enhancement of Ferroelectric Polarization Stability by Interface Engineering, Adv. Mater. 24, Jan. 25, 2012, pp. 1209-1216.

Stengel et al., Origin of the dielectric dead layer in nanoscale capacitors, Nature, vol. 443, Oct. 12, 2006, pp. 679-682.

Stengel et al., Enhancement of ferroelectricity at metal-oxide interfaces, Nature Materials, vol. 8, Apr. 19, 2009, pp. 392-397.

Zhang et al., Disappearance of ferroelectric critical thickness in epitaxial ultrathin BaZrO3 films, Physical Review B 90, Nov. 20, 2014, pp. 184107-1-184107-7.

Puggioni et al., Polar metals as electrodes to suppress the critical-thickness limit in ferroelectric nanocapacitors, Abstract Submitted for the MAR17 Meeting of The American Physical Society, Jan. 5, 2017.

Puggioni et al., Polar metals as electrodes to suppress the critical-thickness limit in ferroelectric nanocapacitors, Presentation, Mar. 14, 2017.

Puggioni et al., Polar metals as electrodes to suppress the critical-thickness limit in ferroelectric nanocapacitors, arXiv:1611.06300v2, Jul. 21, 2017.

Puggioni et al., Polar metals as electrodes to suppress the critical-thickness limit in ferroelectric nanocapacitors, arXiv:1611.06300v1, Nov. 19, 2016.

H.J. Xiang, Origin of polar distortion in LiNbO3-type "ferroelectric" metals: Role of A-site instability and short-range interactions, Physical Review B 90, Sep. 8, 2014, pp. 094108-1-094108-7.

* cited by examiner

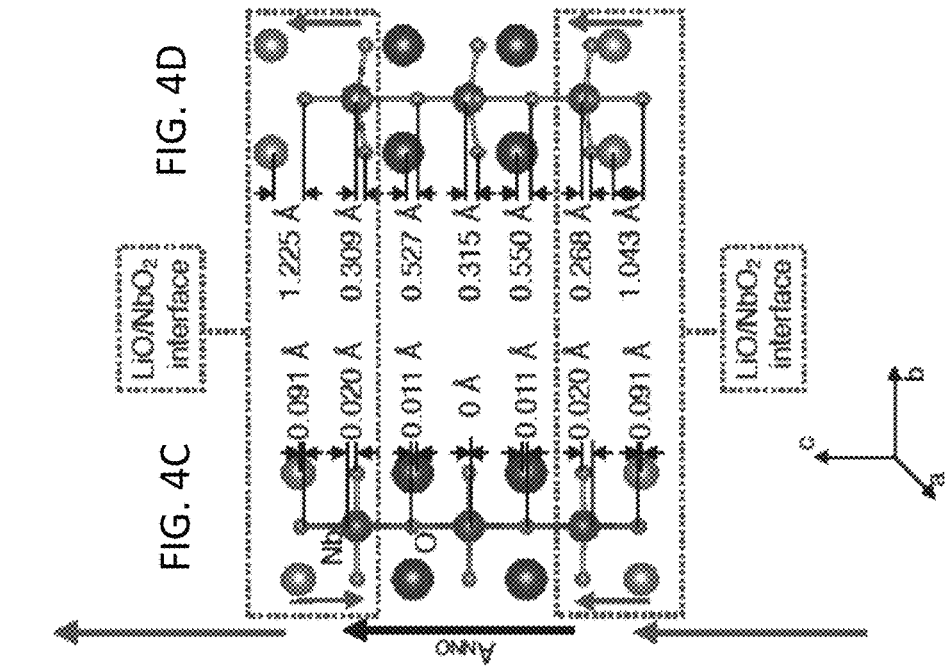
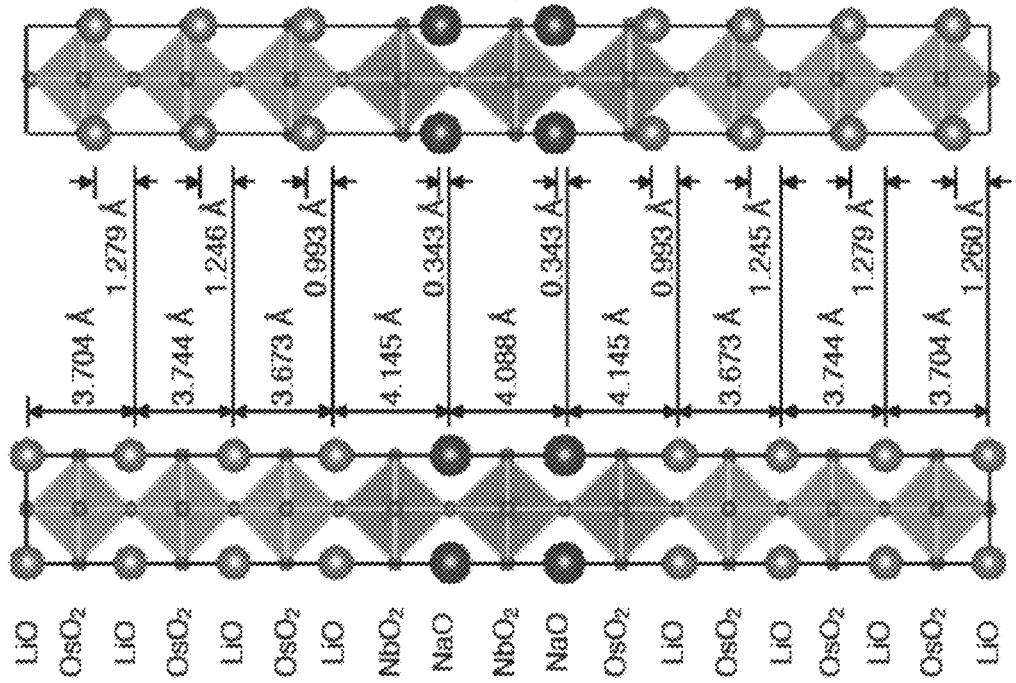
FIG. 4A FIG. 4B FIG. 4C FIG. 4D

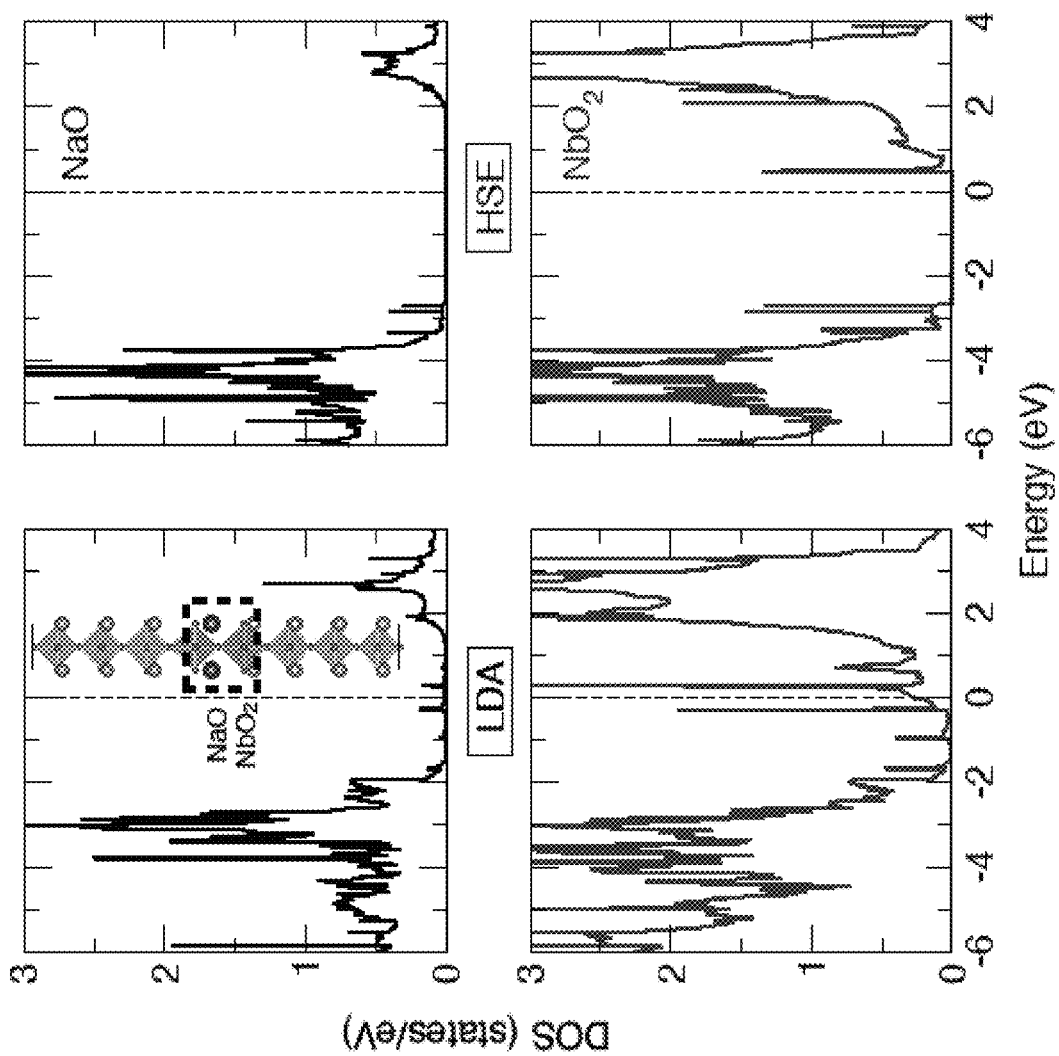

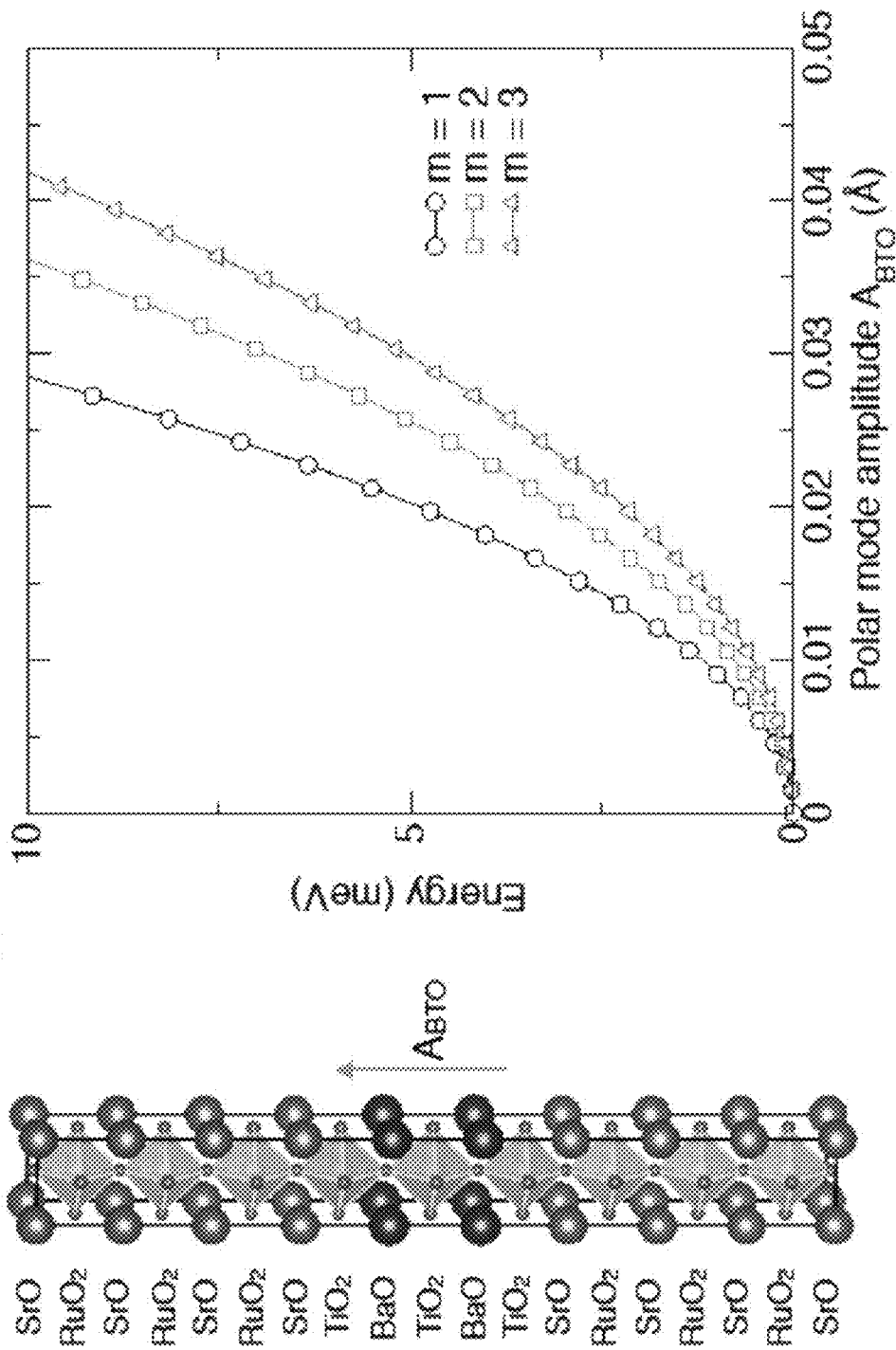

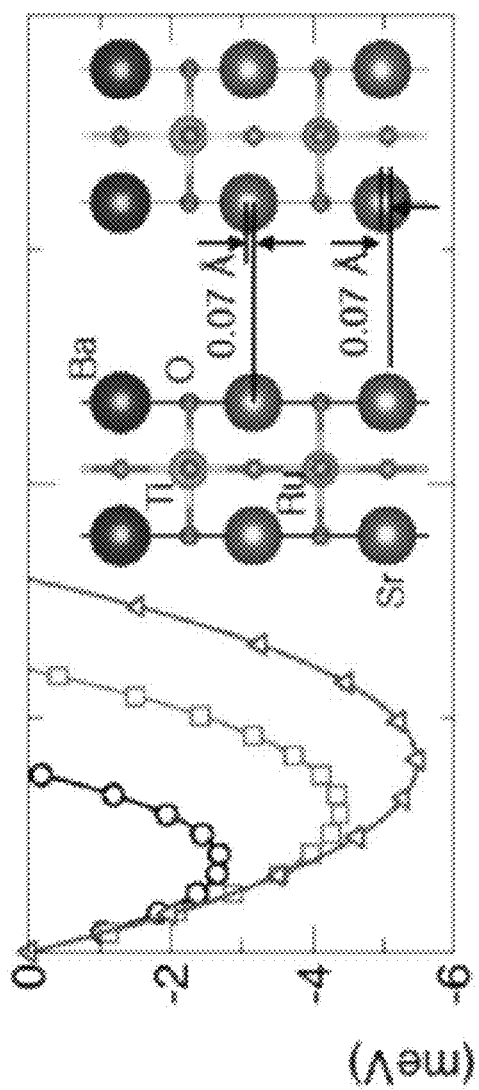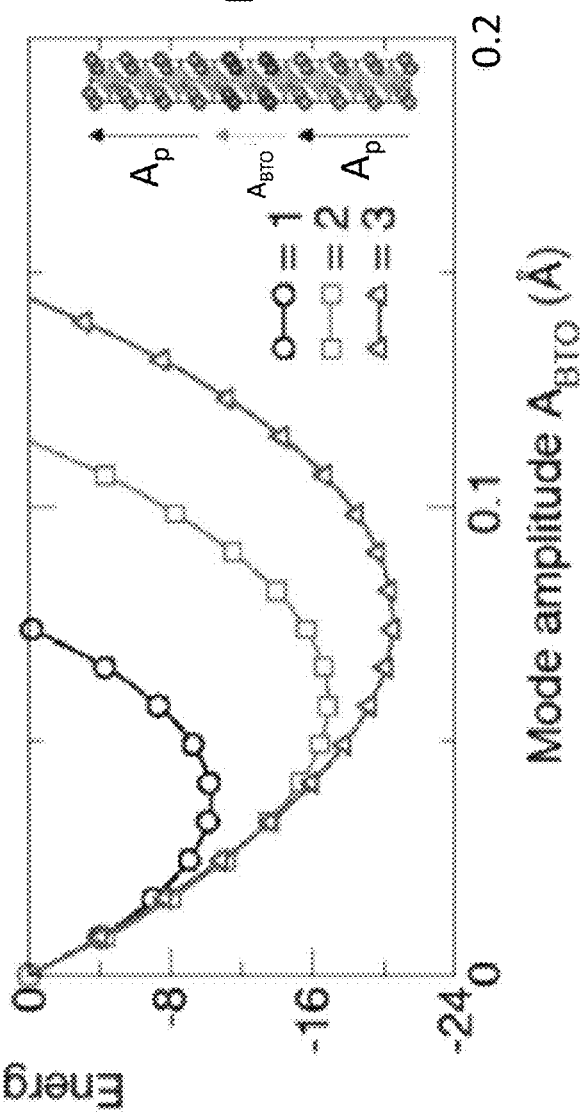
FIG. 8A
FIG. 8B

US 10,186,595 B2

NONCENTROSYMMETRIC METAL ELECTRODES FOR FERROIC DEVICES

CROSS-REFERENCE TO RELATED APPLICATIONS

The present application claims priority to U.S. Provisional Patent Application No. 62/371,345 that was filed Aug. 5, 2016, the entire contents of which are hereby incorporated by reference.

REFERENCE TO GOVERNMENT RIGHTS

This invention was made with government support under W911NF-15-1-0017 awarded by the Army Research Office. The government has certain rights in the invention.

BACKGROUND

Ferroelectric perovskite oxides with a spontaneous electric polarization have potential applications in nonvolatile random access memories and high-density data storage devices. Following consumer demands for higher density data storage technologies, a continuing miniaturization of electronic components has been the major focus of researchers and industry. To achieve this aim for devices which integrate ferroelectric oxides, one of the most important issues is how to maintain ferroelectricity (and electric polarizations) when the component size reduces to the nanometer scale. Specifically, finding effective and robust routes to reduce the critical thickness (before ferroelectricity vanishes) and thus improve ferroelectric stability of ultrathin films is of critical importance.

SUMMARY

Provided are ferroelectric heterostructures and devices including the heterostructures, e.g., capacitors and field-effect transistors.

In one aspect, ferroelectric heterostructures are provided. In an embodiment, a ferroelectric heterostructure comprises a ferroelectric layer comprising a ferroelectric material and a first electrode layer comprising a first noncentrosymmetric metal, the first electrode layer disposed on the ferroelectric layer to form a ferroelectric-first electrode interface, wherein the ferroelectric layer is characterized by exhibiting an electric polarization and the first electrode layer is characterized by exhibiting polar ionic displacements and further wherein, a component of the polar ionic displacements of the first electrode layer is parallel to a component of the electric polarization of the ferroelectric layer.

The ferroelectric heterostructure may be incorporated into a capacitor. In an embodiment, a capacitor comprises the ferroelectric heterostructure described above and a second electrode layer comprising a second noncentrosymmetric metal, wherein the ferroelectric layer is between the first and second electrode layers to further form a ferroelectric-second electrode interface, wherein the second electrode layer is characterized by exhibiting polar ionic displacements and further wherein, a component of the polar ionic displacements of the second electrode layer is parallel to the component of the electric polarization of the ferroelectric layer.

Either ferroelectric heterostructure may be incorporated into a field-effect transistor. In an embodiment, a transistor comprises either ferroelectric heterostructure disposed over a substrate, a source electrically coupled to the substrate and a drain in electrically coupled to the substrate.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIGS. 4A-4D show a symmetric nanocapacitor according to an illustrative embodiment of the present disclosure. FIG. 4A shows a centrosymmetric nanocapacitor with insulating $NaNbO_3$ (m=2) between $LiOsO_3$ electrodes (n=6). FIG. 4B shows the equilibrium structure of the ferroelectric capacitor [LiO—($OsO_2$—LiO)$_6$/$NbO_2$—(NaO—$NbO_2$)$_2$]. The direction of the polar displacements in the electrodes and the ferroelectric film ($A_{NNO}$) are indicated with arrows. FIG. 4C shows a magnification of the LiO/$NbO_2$ interface of the paraelectric aristotype. FIG. 4D shows a magnification of the LiO/$NbO_2$ interface of the ground state structure. The FE behavior at the interface is due to the Li, Nb, and O displacements. The direction of the polar displacements at the interfaces for the paraelectric and the ground state structure is indicated with arrows.

FIG. 5A depicts projected densities-of-states (DOS) for the $NaNbO_3$ layer in the $LiOsO_3$/$NaNbO_3$/$LiOsO_3$ (m=1) nanocapacitor within LDA. FIG. 5B shows projected densities-of-states (DOS) for the $NaNbO_3$ layer in the $LiOsO_3$/$NaNbO_3$/$LiOsO_3$ (m=1) nanocapacitor within HSE06. The inset shows the $LiOsO_3$/$NaNbO_3$/$LiOsO_3$ (m=1) nanocapacitor.

FIGS. 7A and 7B depict typical behavior of a comparative conventional nanoscale ferroelectric capacitor below the critical thickness. FIG. 7A shows a nanocapacitor consisting of a $BaTiO_3$ film (m=2) between centrosymmetric $SrRuO_3$ (n=6) electrodes. The arrow indicates the direction of the polar displacements in BaTiO$_3$. FIG. 7B depicts energy as a function of the polar mode amplitude A$_{BTO}$ in BaTiO$_3$. The energy increases for all thicknesses m analyzed.

FIGS. 8A and 8B show the energetic landscape of a BaTiO$_3$ nanocapacitor with "polar" SrRuO$_3$ electrodes. Energetic gain is shown for different dielectric thicknesses: m=1 (circles), m=2 (squares) and m=3 (diamonds). The Sr displacements given with respect to the centrosymmetric ground state are fixed to 0.07 Å in FIG. 8A (see inset) and 0.14 Å in FIG. 8B. The energy of the polar structure with A$_{BTO}$=0 Å is taken as reference for each m.

FIG. 10A shows a FE-FET including a metal gate electrode, a ferroelectric layer, and a semiconductor substrate; FIG. 10B shows a FE-FET including a metal gate electrode, a ferroelectric layer, an insulator (buffer) layer, and a semiconductor substrate; FIG. 10C shows a FE-FET including a metal gate electrode, a ferroelectric layer, another layer of metal, an insulator (buffer) layer, and a semiconductor substrate; and FIG. 10D shows a FE-FET including a metal gate electrode, a ferroelectric layer, a conducting oxide layer, and a perovskite substrate. As further described below, the disclosed noncentrosymmetric metals may be used for the metal gate electrodes/layer of metal (FIG. 10C)/conducting oxide (FIG. 10D) while the disclosed ferroelectric materials may be used for the ferroelectric layers shown in these figures.

DETAILED DESCRIPTION

Provided are ferroelectric heterostructures and devices including the heterostructures, e.g., capacitors and field-effect transistors.

The present disclosure makes use of noncentrosymmetric metal electrodes to cause the critical thickness for ferroelectricity to effectively vanish (become non-existent) for a variety of ferroelectric materials. This unique approach solves the problem of miniaturization from an entirely different point of view as compared to conventional approaches. Specifically, the present approach focuses on the properties of the metal electrode of ferroelectric heterostructures. By contrast, conventional approaches make use of centrosymmetric metal electrodes and instead focus on the properties of the ferroelectric layer of the heterostructures.

Figure 1:
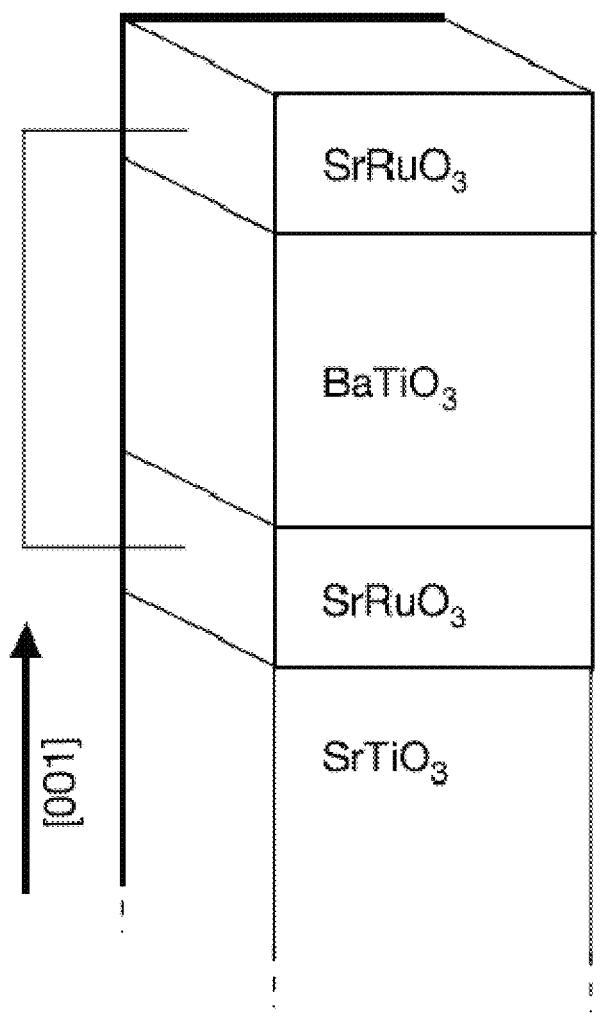
FIG. 1 shows the structure of a conventional ferroelectric capacitor including a $BaTiO_3$ film between $SrRuO_3$ electrodes that are short-circuited.

The miniaturization problem is illustrated with the conventional ferroelectric capacitor shown in FIG. 1. The capacitor includes a ferroelectric BaTiO$_3$ (BTO) film between centrosymmetric SrRuO$_3$ (SRO) electrodes. Owing to an intrinsic size effect and a depolarizing field that results from poor screening by the itinerant electrons in the electrode, the thickness of ferroelectric film is limited to a critical thickness. Below this critical thickness, the ferroelectric polarization inevitably disappears, rendering the devices non-functional.

Figure 2:
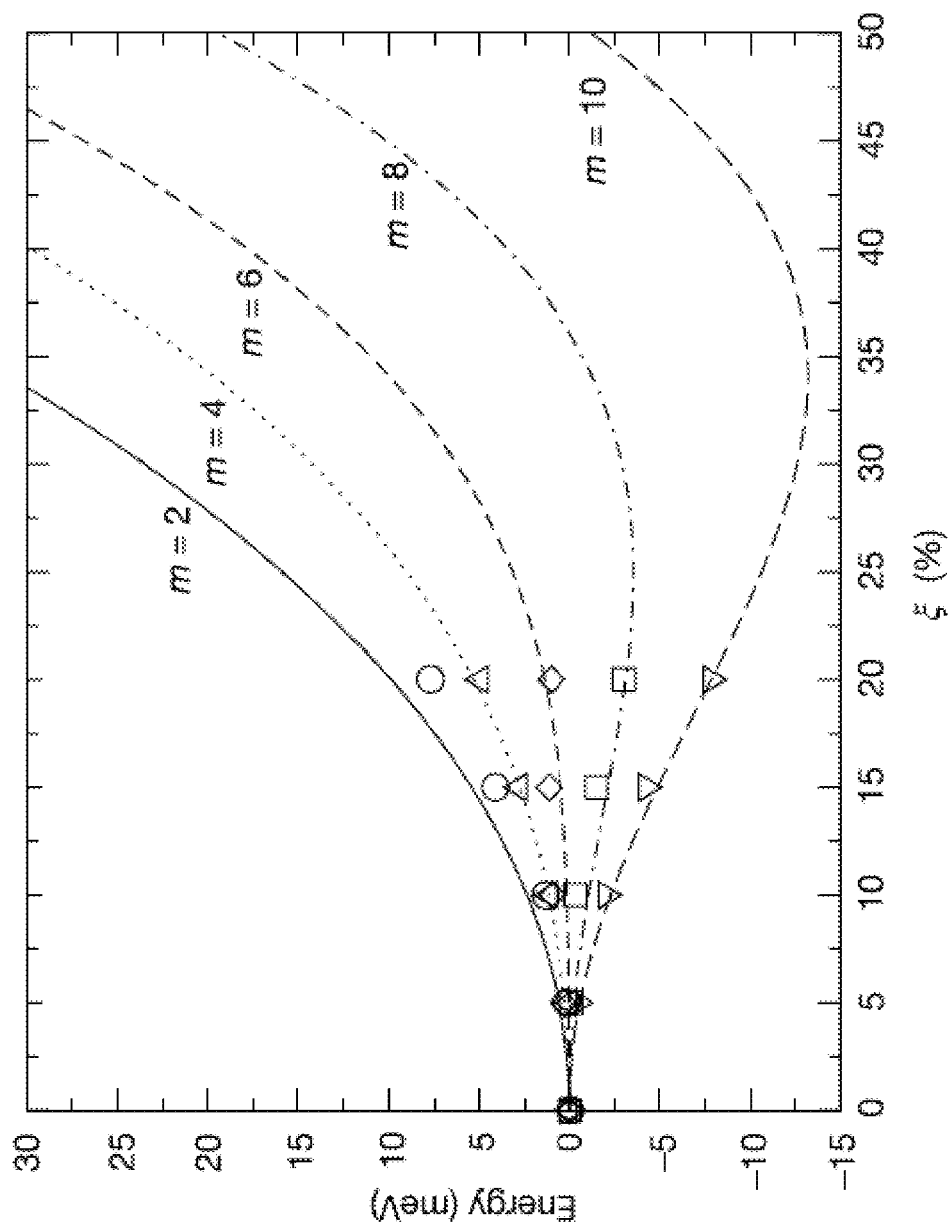
FIG. 2 shows the evolution of the energy as a function of the soft-mode distortion for the capacitor of FIG. 1. These are the first-principles calculations reported by J. Junquera et al., Nature 422, 506 (2003) for different thicknesses of the ferroelectric film: m=2, m=4, m=8, and m=10.

Indeed, first-principles calculations by show that a BTO film loses its ferroelectricity at a critical thickness of 2.4 nm. (J. Junquera, et al., Nature 422, 506 (2003).) These calculations, shown in FIG. 2, reveal that for different thicknesses of the BaTiO$_3$ layer, indicated by the symbols, there is a clear evolution from a stable ferroelectric (at large thicknesses, m>6) to an unstable ferroelectric state (and small thicknesses, m≤6). Note that the symbols in FIG. 2 show the evolution of the energy (with respect to the reference paraelectric phase) upon freezing-in atomic displacements parameterized by ξ with increasing amplitude. Thus, the change in stability of the ferroelectric behavior occurs at a critical thickness around m=6 (26 Å). For larger thicknesses, the energy decreases when the atoms follow the bulk soft-mode path, clearly demonstrating that the film has a ferroelectric ground state (in agreement with experimental results for the same thickness (see *Appl. Phys. Lett.* 75, 856-858 (1999)). By contrast, below the critical thickness, the energy is minimized for the paraelectric configuration. These theoretical predictions were confirmed experimentally (see *Appl. Phys. Lett.* 86, 102907 (2005). (For conventional ferroelectric capacitor behavior, see also FIGS. 7A and 7B, further described in the Examples, below.)

Thus, as used in the present disclosure, the phrase "critical thickness value" refers to the thickness value at which a ferroelectric layer loses its ferroelectricity. This critical thickness value will be different for different ferroelectric layers made up of different ferroelectric materials. However, the critical thickness value can be calculated and/or measured using the techniques described above (as well as those described in the Examples, below).

As noted above, by contrast to prior art ferroelectric heterostructures, the present ferroelectric heterostructures make use of noncentrosymmetric metal electrodes. In embodiments, a ferroelectric heterostructure comprises a ferroelectric layer comprising a ferroelectric material and a first electrode layer comprising a first noncentrosymmetric metal, the first electrode layer disposed on the ferroelectric layer. The ferroelectric layer and the first electrode layer are in direct contact so as to form a ferroelectric-first electrode interface.

As demonstrated in detail in the Examples section, this approach of using noncentrosymmetric metal electrodes is capable of maintaining the ferroelectricity of a variety of ferroelectric layers made of different ferroelectric materials even when the thickness of the ferroelectric layer is on the (sub)-nanometer scale, including below the critical thickness value of the ferroelectric layer. Such devices and ferroelectric layers include capacitors and memories based on BaTiO$_3$, utilizing its high dielectric response; electromechanical transducers based on Pb(Zr$_{0.52}$Ti$_{0.48}$)O$_3$ (PZT), utilizing its high piezoelectric coefficient; pyroelectrics such as PbTiO$_3$ and (Sr,Ba)Nb$_2$O$_6$; and electrooptical components based on LiNbO$_3$. This finding that noncentrosymmetric metal electrodes can cause the critical thickness value for ferroelectricity to effectively vanish (become non-existent) enables the aggressive scaling of ferroelectric capacitors below current dimensional constraints. This, in turn, enables the next generation of IT equipment such as ultra-high-speed mobile computing, communication devices, and sophisticated sensors.

By "noncentrosymmetric metals," it is meant a distinct class of compounds characterized by the following properties. First, noncentrosymmetric metals are crystalline compounds characterized by a crystal structure that lacks inversion symmetry (i.e., has no inversion center). Regarding crystal structure, there are 21 noncentrosymmetric point groups: 1, 2, m, 222, mm2, 4, 422, $\bar{4}$, 4mm, $\bar{4}$ 2m, 3, 32, 3m, 6, 622, $\bar{6}$, 6 mm, $\bar{6}$ 2m, 23, 432, and $\bar{4}$ 3m. Second, the noncentrosymmetric metals of the present disclosure are polar, characterized by a polar axis, polar ionic displacements, and are characterized by one of the following 10 polar point groups, which are a subset of the aforementioned 21 noncentrosymmetric point groups: 1, 2, m, mm2, 4, 4mm, 3, 3m, 6, and 6 mm. Third, noncentrosymmetric metals exhibit metallic behavior, i.e., an ability to conduct electrons with a minimum resistivity value of approximately 1000 µΩ·cm at room temperature. The free carriers may arise from either a high density of partially occupied electronic states at the Fermi level as in a band conductor or by degenerately doping a ferroelectric material to achieve the required resistivity minimum. However, the doped and conducting ferroelectric material must maintain its polar ionic displacements as described above. The present disclosure may refer to "noncentrosymmetric metals" as "polar metals" and "ferroelectric metals." These three terms are used interchangeably in the present disclosure.

A variety of noncentrosymmetric metals may be used in the ferroelectric heterostructures. The first electrode layer may comprise combinations of different types of noncentrosymmetric metals. Illustrative noncentrosymmetric metals include those listed in Table 1, below. Other noncentrosymmetric metals include those disclosed in *Nature Materials* 12, 1024-1027 (2013); *Nat. Commun.* 5, 3432 (2014); *Phys. Rev. B*90, 094108 (2014); and *J. Mater. Chem. C* 4, 4000-4015 (2016), each of which is hereby incorporated by reference in its entirety.

TABLE 1

Illustrative noncentrosymmetric metals.

| | | |
|---|---|---|
| $Rh_2Ga_9$ | $La_2NiAl_7$ | $Sr_3Cu_8Sn_4$ |
| $Ru_7B_3$ | CaAlSi | $Li_{17}Ag_3Sn_6$ |
| BiPd | $Li_2IrSi_3$ | $LiOsO_3$ |
| UIr | $CeRuSi_3$ | $Ca_3Ru_3O_7$ |
| $Mg_2Al_3$ | $SrAuSi_3$ | $RESr_2Cu_2GaO_7$, wherein RE is any of La through Yb or Y |
| $Ir_9Al_{28}$ | $CePt_3Si$ | $BaVS_3$ |
| $Ir_2Ga_9$ | $AIrSi_3$ wherein A is Ca or Ce | $AV_6S_8$, wherein A is K, Rb, Cs, or Tl |
| $Rh_2Ga_9$ | $ARhSi_3$, wherein A is Ce or La | $La_4Mg_5Ge_6$ |
| γ-$Bi_2Pt$ | $APtSi_3$, wherein A is Ca, Ba, or Eu | $La_4Mg_7Ge_6$ |
| $Au_{6.05}Zn_{12.51}$ | $ACoGe_3$, wherein A is Ce, Pr, or La | $Yb_2Ga_4Ge_6$ |
| $Ba_{21}Al_{40}$ | $LaASi_3$, wherein A is Ir or Pd | ErPdBi |
| $Cr_5Al_8$ | $CeAGe_3$, wherein A is Ir or Rh | LuPtBi |
| $Mn_5Al_8$ | $EuNiGe_3$ | $Ce_2Rh_3(Pb, Bi)_5$ |
| $Cu_{7.8}Al_5$ | $EuPdGe_3$ | $Eu_2Pt_3Sn_5$ |
| $Cu_7Hg_6$ | $LaAGe_3$, wherein A is Co, Fe, Ir or Rh | $Lu_4Zn_5Ge_6$ |
| $NbS_2$ | $SrAGe_3$, wherein A is Pd or Pt | $IrMg_{2.03}In_{0.97}$ |
| $Sn_4As_3$ | $REPdIn_2$, wherein RE is Ce, Pr, Nd, Sm, Gd, Tb, Dy, Ho, Er, Tm, Lu or Y | $IrMg_{2.20}In_{0.80}$ |
| $Sn_4P_3$ | $REAuGe$, wherein RE is Ce, Lu, Sc or Ho | CeAuSn |
| $REPt_3B$, wherein RE is La, Pr, or Nd | $La_{15}Ge_9X$, wherein X is C, Co, Fe, or Ni | $LaGeSi_3$ |
| $La_5B_2C_6$ | HoAuGe | |
| $LaNiC_2$ | CeCuSn | |

A variety of ferroelectric materials may be used in the ferroelectric heterostructures and the ferroelectric layer may comprise combinations of different types of ferroelectric materials. Ferroelectric materials also make up a distinct class of compounds characterized by ferroelectricity, i.e., reversible spontaneous electric polarization.

In embodiments, the ferroelectric material is an oxide such as a perovskite oxide. A variety of perovskite oxides may be used, including cubic perovskite oxides and double perovskite oxides. Illustrative ferroelectric perovskite oxides include the following: $BaTiO_3$; $Ba_xSr_{1-x}TiO_3$ wherein 1>x>0; $PbTiO_3$; $BaZrO_3$; $Pb(Zr_xTi_{1-x})O_3$ wherein 1≥x≥0; $(Sr,Ba)Nb_2O_6$; $NaNbO_3$; $BiFeO_3$; and $YMnO_3$. Other ferroelectric oxides include the Ruddlesden-Popper oxide $Sr_xCa_{3-x}Ti_2O_7$ wherein 1>x>0; the Aurivillius oxide $SrBi_2Ta_2O_9$; and the lithium-niobate structured oxide $LiNbO_3$. Additional multication ferroelectric oxides include $Sr(Ta,Nb)_2O_7$; $Gd_2(MoO_4)_3$; and $Pb_5Ge_3O_{11}$. However, the ferroelectric material need not be an oxide. Other illustrative ferroelectric materials that are non-oxides include $BaMnF_4$, GeTe, $SrAlF_5$, and SbSI.

Other ferroelectric materials include proper ferroelectrics, improper ferroelectrics, hybrid improper ferroelectrics, and hyperferroelectrics. Proper ferroelectrics are those ferroelectric materials in which the phase transition parameter is the electric polarization. Improper and hybrid-improper ferroelectrics are ferroelectric materials in which the phase transition parameter is not the homogeneous electric polarization. These proper versus improper notations refer to the phase transition itself and the electric polarization in the static ferroelectric material. Hyperferroelectrics are a subclass of proper ferroelectrics in which the polarization persists in the presence of a depolarization field.

The ferroelectric material (and ferroelectric layer) may be substantially strain free. By "substantially strain free" it is meant that the strain in the material is less than about 0.5%, where strain is defined as the difference between the equilibrium lattice constant of the material, $a_f$, and the equilibrium lattice constant of the underlying substrate, $a_s$, upon which a layer of the material is grown, normalized by the lattice constant of the material: $(a_s-a_f)/a_f \times 100\%$. However, in other embodiments, the ferroelectric material (and the ferroelectric layer) may be coherently strained, e.g., strained $SrTiO_3$, without relaxation of the lattice constant of the film. Strain ranges may vary up to +3% (tensile strain) or −3% (compressive strain).

In embodiments, the ferroelectric material of the ferroelectric heterostructure is selected from $SrBi_2Ta_2O_9$, $Bi_4Ti_3O_{12}$, $PbZr_{1-x}Ti_xO_3$ (0≤x≤1), $BaTiO_3$, $BiFeO_3$, and combinations thereof; and the noncentrosymmetric metal is selected from $Ca_3Ru_2O_7$, CeCuSn, CeAuSn, $CaIrSi_3$, $CaPtSi_3$, $LaIrSi_3$, $LaGeSi_3$, $LiOsO_3$ and combinations thereof.

In the ferroelectric heterostructure, the ferroelectric layer is characterized by exhibiting an electric polarization and the first electrode layer comprising the noncentrosymmetric metal is characterized by exhibiting polar ionic displacements and further wherein, a component of the polar ionic displacements of the first electrode layer is parallel to a component of the electric polarization of the ferroelectric layer. This parallel alignment (versus antiparallel or orthogonal alignment) may be ensured during growth of the ferroelectric layer/first electrode layer.

Figure 3:
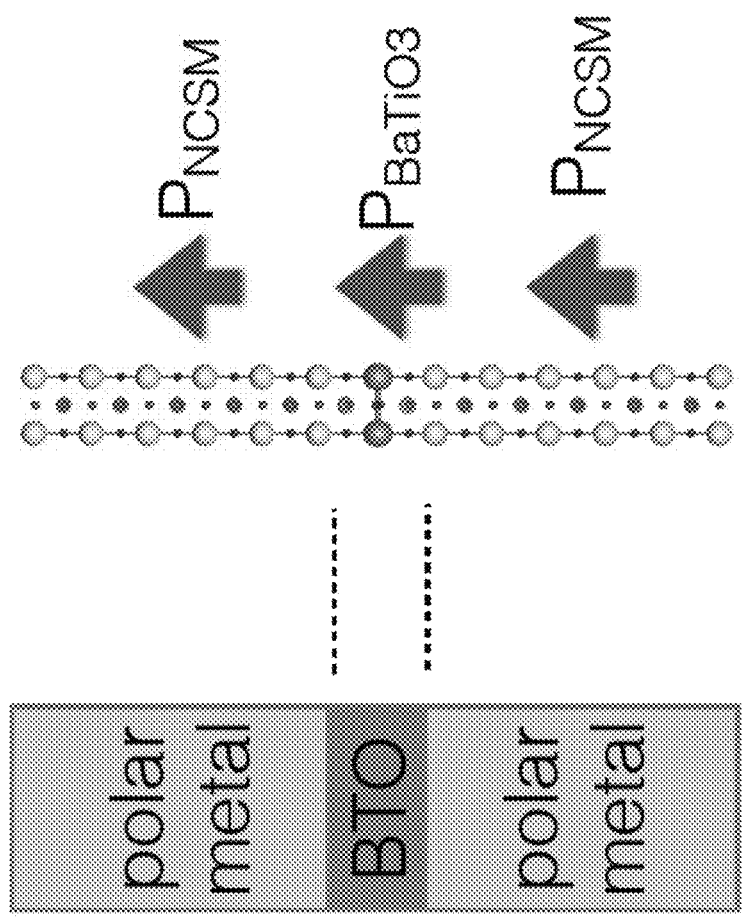
FIG. 3 shows the structure of a ferroelectric capacitor according to an illustrative embodiment of the present disclosure. The capacitor makes use of noncentrosymmetric metal (NSCM) electrodes, i.e., polar metal electrodes. Such a ferroelectric capacitor may include a $BaTiO_3$ film between $LiOsO_3$ electrodes that are short-circuited: [LiO—($OsO_2$—LiO)$_5$/$TiO_2$—(BaO—$TiO_2$)$_m$]. Also shown is the atomic representation of the related supercell thatwas simulated (for the case m=1). $P_{NCSM}$ and $P_{BaTiO3}$ are the polar displacements (ferroelectric distortions) in $LiOsO_3$ and $BaTiO_3$, respectively.

The ferroelectric heterostructure may further comprise a second electrode layer comprising a second noncentrosymmetric metal, the second electrode layer disposed under the ferroelectric layer. Again, the ferroelectric layer and the second electrode layer are in direct contact so as to form a ferroelectric-second electrode interface. The result is a sandwich structure (effectively a capacitor) as illustrated in FIG. 3 for a ferroelectric heterostructure including a ferroelectric layer of $BaTiO_3$ between an upper electrode of the noncentrosymmetric metal $LiOsO_3$ and a lower electrode of the noncentrosymmetric metal $LiOsO_3$. In embodiments, such as that shown in FIG. 3, the ferroelectric heterostructure is a symmetric ferroelectric heterostructure, by which it is meant that the first and second electrode layers are composed of the same material(s). However, this is not a requirement. Asymmetric ferroelectric heterostructures in which the first and second electrode layers are composed of different materials may also be used. Selection of the second noncentrosymmetric metal and the materials of the second electrode layer follow that described above with respect to the first noncentrosymmetric metal/materials of the first electrode layer.

As noted above, the use of noncentrosymmetric metals means that the critical thickness value for ferroelectricity in the ferroelectric layer effectively vanishes. This means that the present ferroelectric heterostructures may make use of ferroelectric layers having thicknesses which are significantly smaller than those in conventional ferroelectric heterostructures, including thicknesses which are below the critical thickness value of the selected ferroelectric material(s). As noted above, a ferroelectric material (and thus the ferroelectric layer) is characterized by a critical thickness value, the magnitude of which may be calculated or measured. In embodiments, the thickness of the ferroelectric layer in the ferroelectric heterostructure is less than the critical thickness value of the ferroelectric layer. Such thicknesses would not be used in conventional ferroelectric heterostructures since the heterostructures would be non-functional due to loss of ferroelectricity. In embodiments, the thickness of the ferroelectric layer may be in the range of from about the thickness of a single unit cell of the selected ferroelectric material to less than the critical thickness value of the ferroelectric layer. The term "thickness," when used in reference to the ferroelectric layer in the ferroelectric heterostructure (as opposed to its critical thickness value) may refer to an average value as measured from a representative number of cross-sections of the ferroelectric layer.

Regarding the first and second electrode layers, the layers may be formed to have a variety of thickness values. Again, the term "thickness" may refer to an average value analogous to that defined above for the ferroelectric layer. In embodiments, the first and second electrode layers may be characterized by an average thickness of at least about 2 nm, at least about 10 nm, at least about 25 nm, at least about 50 nm, at least about 100 nm, etc. Greater average thicknesses may also be used.

Figure 6:
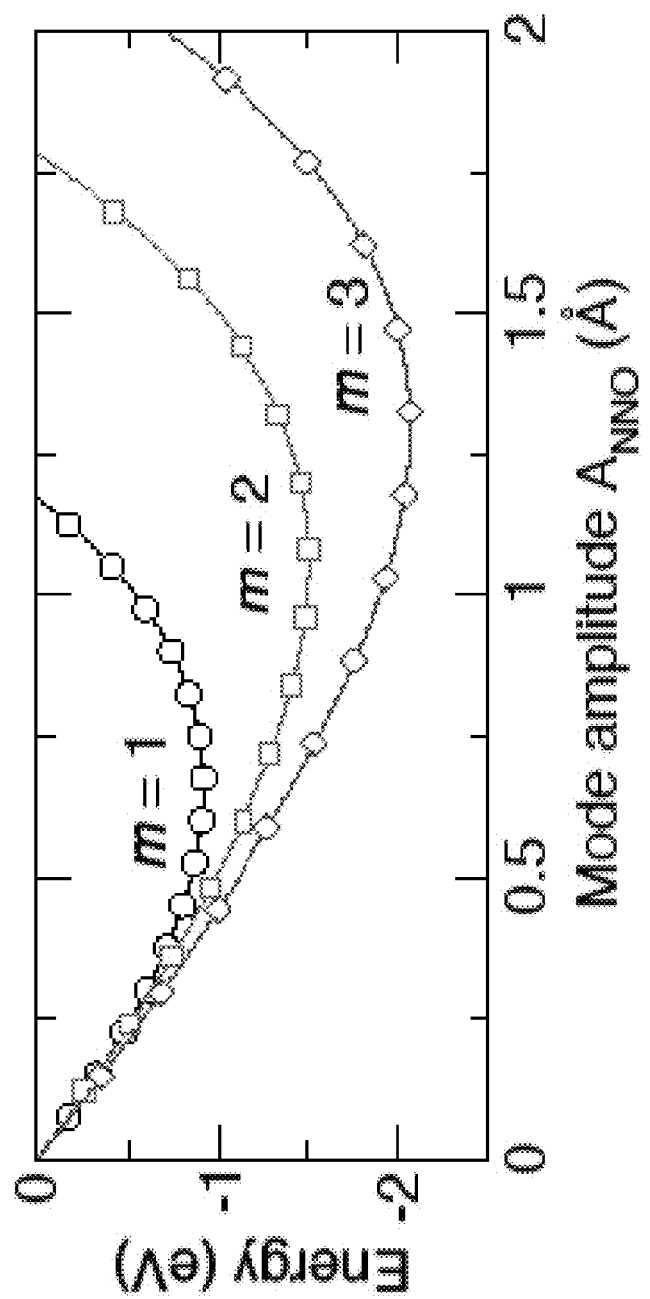
FIG. 6 depicts energetic gain with increasing polar mode amplitude $A_{NNO}$ in the $NaNbO_3$ film for different thicknesses: m=1 (circles), m=2 (squares) and m=3 (diamonds). A finite value of $A_{NNO}$ leads to an energetic gain for all m, indicating the disappearance of the critical thickness. Note that the energy of the polar ground state structure with $A_{NNO}$=0 is taken as reference for each value of m. The energy gain increases as the thickness of the ferroelectric film increases owing to the reduced effects from the depolarizing field, which dominates thinner films.

Even when the ferroelectric heterostructures include ferroelectric layers having a thickness less than the critical thickness value, they exhibit ferroelectricity. This may be confirmed using the calculations described in the Examples, below, e.g., by confirming that the ground state of the ferroelectric heterostructure is the ferroelectric state using energy versus $A_{NNO}$ plots as shown in FIG. 6. Alternatively, the existence of ferroelectricity may be verified experimentally using scanning probe microscopies (SPM) or the Positive-Up Negative-Down (PUND) method to obtain the displacement current. (See *Journal of Applied Physics* 64, 787 (1988).)

The ferroelectric heterostructures may be used in a variety of devices and device components, including capacitors (e.g., see FIG. 3) and field-effect transistors (e.g., see FIGS. 10A-10D).

In embodiments, the first electrode layer of the ferroelectric heterostructure forms only a single ferroelectric-first electrode interface, i.e., with the ferroelectric layer. Similarly, in embodiments including the second electrode layer, this second electrode layer may also form only a single ferroelectric-second electrode interface, i.e., with the ferroelectric layer. Other material layers may be in direct contact with the first and second electrode layers, but in such embodiments, the first and second electrode layers are not in direct contact with another ferroelectric material/layer. In embodiments, the ferroelectric layer is the only ferroelectric layer in the heterostructure. Other material layers may be included in the ferroelectric structure, but in such embodiments, the heterostructure comprises a single ferroelectric layer. Such embodiments exclude the ferroelectric heterostructures from being a subcomponent of superlattice or multi-quantum well structures having periodically alternating ferroelectric/noncentrosymmetric metal layers. Thus, such ferroelectric heterostructures are not part of a superlattice or multi-quantum well structure.

A variety of known thin film deposition or growth techniques may be used to form the ferroelectric heterostructures, capacitors, transistors, etc.

Illustrative applications for the present disclosure include the following: ferroelectric capacitors to make ferroelectric random access memory (FeRAM) for computer and electronic devices; ferroelectric tunnel junctions (FTJs) utilizing ferroelectric capacitor structures and associated solid state memories based on them; ferroelectric field-effect transistors (FeFET); integration into high dielectric random access memory (DRAM); ferroelectric capacitors for radio-frequency identification technology; and ferroelectric capacitors for sensor applications such as medical ultrasound machines, high quality infrared cameras, fire sensors, sonar, vibration sensors, and even fuel injectors on diesel engines.

EXAMPLES

Introduction

When ferroelectric (FE) oxides are utilized in metal/oxide heterostructures and nanocapacitors, scaling of the active FE is required to improve performance [1-3]. Nonetheless, deleterious nanoscale effects are amplified in these geometries [4-6] and act to eliminate the functional electric polarization [7-9]. The loss of ferroelectricity in nanoscale capacitors frequently occurs when the polarization is perpendicular to the film surface [4, 10-12], i.e., the desired polarization direction for field-tunable devices [13]. Bound charges are only partially screened at the interface, resulting in a strong depolarizing field that suppresses the polarization. Indeed, numerous reports suggest a critical thickness, $t_{FE}*$, below which the electric polarization disappears. Experimental studies on $PbTiO_3$ find $t_{FE}*\sim20$ Å at 300 K [14], whereas $t_{FE}*\sim4.0$ nm, in $Pb(Zr_{0.2}Ti_{0.8})O_3$ films [8]. Furthermore, first-principles density functional theory (DFT) calculations predict $t_{FE}*\sim2.4$ nm in single-domain $BaTiO_3$ films between $SrRuO_3$ electrodes [4], which reduces to $t_{FE}*\sim1.0$ nm after accounting for ionic relaxation in the electrodes [5, 6]. With this limitation, ferroelectric based devices are unable to meet the continuous scaling changes demanded by higher density data storage technologies.

Although proposals to overcome the problem exist, a general solution remains elusive. Most approaches focus on tuning the stability of the FE state. Epitaxial strain engineering has been proposed; nonetheless, this strategy extends to a limited number of oxides, requires complex processing steps, and is limited by available commercial substrates. For example, although it is predicted that $t_{FE}*\rightarrow 0$ in thin films of the incipient ferroelectric $BaZrO_3$, a large epitaxial compressive strain of 4.25% is required [15], which would produce deleterious misfit dislocations. Integration with silicon is likely to also lead to uncontrolled interface states [16]. Furthermore, at this level of strain $t_{FE}^*$ is still finite for BaTiO$_3$ (Ref. 15).

Alternative solutions change the type of ferroelectric and the active inversion symmetry lifting mechanism. Ab-initio calculations find that $t_{FE}^* \to 0$ using so-called hyperferroelectrics [17], which have a persistent polarization different from proper FE oxides, or improper ferroelectrics [18, 19]. However, hyperferroelectric bulk materials (and thin films) remain to be synthesized [20]. Another route relies on creating an enhanced interfacial FE state by controlling the covalency of the metal-oxygen bond at the heterointerface [21-24].

Here the critical thickness is examined for ferroelectricity in nanocapacitors consisting of polar metal electrodes and conventional ferroelectric oxides under short-circuit boundary conditions using DFT calculations. Recently, polar metals have garnered considerable interest [25, 26] because they exhibit simultaneously inversion-lifting displacements and metallicity. In these compounds, the polar displacements are weakly coupled to the states at the Fermi level, which makes possible the coexistence of a polar structure and metallicity [27]. The main finding is that polar metal electrodes suppress the critical thickness limit through interfacial polar displacements, which stabilize the ferroelectric (polarized) state; this geometric effect does not rely on interfacial bond chemistry or 'perfect' screening of the depolarization field, but rather results from the intrinsic broken parity present in the electrode.

Methods

First-principles DFT calculations were performed within the local-density approximation (LDA) and hybrid functional (HSE06, Ref. 28 and 29) as implemented in the Vienna Ab initio Simulation Package (VASP) [30] with the projector augmented wave (PAW) approach [31] to treat the core and valence electrons using the following electronic configurations: $1s^22s^2$ (Li), $5p^66s^25d^6$ (Os), $2s^22p^4$ (O), $5s^25p^66s^2$ (Ba), $3d^24s^2$ (Ti), $4s^24p^65s^2$ (Sr), $4d^75s^1$ (Ru), $2p^63s^1$ (Na), $4p^64d^45s^1$ (Nb). The Brillouin zone integrations are performed with a 13×13×1 Monkhorst-Pack k-point mesh [32] and a 600 eV plane wave cutoff for the LiOsO$_3$/NaNbO$_3$/LiOsO$_3$ and SrRuO$_3$/BaTiO$_3$/SrRuO$_3$ capacitor structures. The atomic positions (force tolerance less than 0.1 meV A°−1) were relaxed using Gaussian smearing (20 meV width).

Below 150 K, NaNbO$_3$ and LiOsO$_3$ are isostructural with rhombohedral space group R3c and pseudocubic lattice parameters of 3.907 Å (Ref. 25), (Ref 33) and 3.650 Å, respectively. Owing to the large lattice mismatch between the two compounds, a symmetric ferroelectric capacitor structure was simulated with an LiO/NbO$_2$ interfacial termination, shown in FIG. 4A, under an epitaxial constraint that would be imposed by a (La$_{0.3}$Sr$_{0.7}$)(Al$_{0.65}$Ta$_{0.35}$)O$_3$ substrate [34]. The out-of-plane lattice parameter was also relaxed. This resulted in a compressive strain of ~1% for NaNbO$_3$ and a tensile strain of ~6% for LiOsO$_3$. Note that at the bulk level, it was found that a tensile strain of about greater than 6% suppressed the polar instability along the [001]-pseudocubic direction of LiOsO$_3$. Moreover, NaNbO$_3$ was selected for the capacitor structures in order to eliminate any charge transfer due to 'polar catastrophe/charge mismatch' physics as the interface: [LiO]$^{1-}$, [NaO]$^{1-}$, [NbO$_2$]$^{1+}$, and [OsO$_2$]$^{1+}$.

For the two ferroelectric capacitors, the layered-oxide notation used in Ref 4 was adopted, that is:
[LiO—(OsO$_2$—LiO)$_n$/NbO$_2$—(NaO—NbO$_2$)$_m$] and
[SrO—(RuO$_2$—SrO)$_n$/TiO$_2$—(BaO—TiO$_2$)$_m$]

to clearly demarcate the interface composition in the LiOsO$_3$/NaNbO$_3$/LiOsO$_3$ and SrRuO$_3$/BaTiO$_3$/SrRuO$_3$ capacitors, respectively. A LiO/NbO$_2$ electrode/ferroelectric interface for the LiOsO$_3$/NaNbO$_3$/LiOsO$_3$ capacitor and a SrO/TiO$_2$ interface termination for the SrRuO$_3$/BaTiO$_3$/SrRuO$_3$ capacitor were used. For both ferroelectric capacitors, the number of 5-atom perovskite units of the electrode at n=6 was constrained to ensure a thickness large enough to avoid interaction between the two interfaces, and m ranged from 1 to 3. The periodic boundary conditions naturally impose the required short-circuit condition between the electrodes. Note that for SrRuO$_3$/BaTiO$_3$/SrRuO$_3$ capacitors, the geometry differs only slightly from that used by Junquera and Ghosez [4], whereby the thickness of this electrode is greater.

The group theoretical analysis was aided by the ISODISTORT software [35]. This software was used to evaluate the geometric-induced inversion symmetry-breaking displacements of the P4mm structure with respect the P4/mmm phase, reducing the polar structure into a set of symmetry-adapted modes associated with different irreducible representations of the P4/mmm phase. The "robust" algorithm was used to match an atom in the undistorted structure to every atom in the distorted structure separated by a threshold distance less than 3 Å.

Results and Discussion

The first ferroelectric nanocapacitor that was focused on consisted of ferroelectric NaNbO$_3$ of varying thickness m confined between electrodes of the experimentally known polar metal LiOsO$_3$ (see FIG. 4A, m=2) [25, 36]. The layered-oxide notation used in Ref 4 was adopted, that is [LiO—(OsO$_2$—LiO)$_n$/NbO$_2$—(NaO—NbO$_2$)$_m$], to clearly demarcate the interface composition (see Methods). Two symmetric nanocapacitors were created with a polar and paraelectric configuration for both LiOsO$_3$ and NaNbO$_3$, respectively. The out-of-plane lattice parameter and the atomics positions of the nanocapacitors for m=1, 2, and 3 were then relaxed. The lowest energy heterostructures were polar with space group P4mm and exhibit large Li ions displacements along the [001]-pseudocubic direction (FIG. 4B). No zone-center dynamical instabilities were found in these heterostructures. Note that structures with an initial paraelectric configuration relaxed into a centrosymmetric structure (space group P4/mmm) with Li atoms displaying large antipolar displacements in LiOsO$_3$ (not shown) that decrease towards the interface (FIG. 4C).

Representation theory analysis was used to examine the inversion lifting distortions (see Methods), and it was found that the distortion vector corresponds to the irreps $\Gamma_1^+$ and $\Gamma_3^-$. The irrep $\Gamma_1^+$ reduced the antipolar displacements in LiOsO$_3$, resulting in the centrosymmetric P4/mmm structure depicted in FIG. 4A. The irrep $\Gamma_3^-$ differs in that it is a polar mode which involves mainly Li ion displacements—the maximum amplitudes being ~1.3 Å in LiOsO$_3$, with decreasing amplitude towards the LiO/NbO$_2$ interface (FIG. 4B). It also consists of polar displacements of all ions in the dielectric NaNbO$_3$ layers with the Nb ions off-centering the most (FIG. 4D)

For all thicknesses, the NaNbO$_3$ thin film maintained a ferroelectric ground state characterized by both Nb and Na displacements (FIG. 4B). A linear polarization-displacement model using the Born effective charge from Ref. 37 resulted in a 0.86 C m$^{-2}$ polarization for NaNbO$_3$ in m=2. An analysis of the differential ionic relaxations in the heterostructure revealed polar displacements at the LiO/NbO$_2$ interfaces—an interfacial ferroelectricity—which are a consequence of the polar metal used as an electrode. This produced an enhanced polarization in the ferroelectric compared to that calculated using the aforementioned procedure in the experimental R3c structure (0.59 Cm$^{-2}$) [38]. In particular, although the two interfaces of the paraelectric structures exhibited antiparallel polar displacements (FIG. 4C) while the interfaces of the polar ground state structures had parallel polar displacements, as shown in FIG. 4D.

FIGS. 5A-5B show the electronic properties for the NaNbO$_3$ layer in the LiOsO$_3$/NaNbO$_3$/LiOsO$_3$ (m=1) nanocapacitor. The LDA functional predicts that the NaNbO$_3$ film will be metallic, rendering the ferroelectric capacitor unusable (FIG. 5A). This behavior is artificial, and is due to the tendency of the LDA functional to underestimate the band gap in insulating compound [39, 40]. This pathological problem was solved for DFT by using a more sophisticated functional which includes a fraction of exact exchange (HSE06). FIG. 5B shows that the hybrid functional fully opened the gap between the O 2p and Nb 4d states. Moreover, it was found that the HSE06-relaxed structures exhibited displacements similar to those obtained from the LDA functional; importantly, polar displacements at the LiO/NbO$_2$ interfaces. This result supports the conclusion that the interfacial ferroelectricity was induced by the polar crystal structure of the metallic electrode and not due to spurious shorting of the capacitor. In the remainder of this paper, results obtained using LDA owing to the similar crystal structure obtained with HSE06 functional are reported.

FIG. 6 shows the evolution of the total energy of each capacitor with mode amplitude A$_{NNO}$, which describes the atomic displacements involved in the soft mode of the NaNbO$_3$ film. The largest energy gain occurred when the thickness of the ferroelectric film increased. Note that the shape of the energy surface did not exhibit the characteristic double well behavior, because in the calculations the polar displacements were fixed in the metallic electrodes and only the amplitude of the polar displacements in NaNbO$_3$ was changed. Independent of the NaNbO$_3$ film thickness, the energy was minimized for the ferroelectric ground state (A$_{NNO}\neq 0$), indicating that an ideal ferroelectric capacitor can be reduced to an ultrathin (single unit cell) size, i.e., t$_{FE}$*→0. The disappearance of the critical-thickness limit to ferroelectricity was the result of the parallel polar displacements present at the electrode/dielectric interfaces (FIG. 4B). The ferroelectric state in ultrathin-film devices depends crucially on the nature of the chemical bonds at the metal/oxide interface. Here, this interfacial bonding occurred and was an immediate consequence of the structure of the polar-metal electrodes. The enhanced and parallel interfacial polar displacements "imprinted" and lead to an overall enhancement of the ferroelectric instability of the film, which is assessed further below. It is emphasized that the interfacial dipole distortions were due to a geometrical mechanism driven by the polar structure of the metallic electrode and not due to the stiffness of the electrode-oxidebonds.

A SrRuO$_3$/BaTiO$_3$/SrRuO$_3$ capacitor (FIG. 7A) was next examined, which as before may be written as [SrO—(RuO$_2$—SrO)$_n$/TiO$_2$—(BaO—TiO$_2$)$_m$] to reveal the layered monoxide planes in the structures. The SrO/TiO$_2$ interface geometry was focused on to demonstrate the generality of this solution to the critical thickness problem. The in-plane lattice parameters were constrained to that of SrTiO$_3$ (3.905 Å), and the out-of-plane lattice parameter and the atomic positions were relaxed (see Methods), examining capacitors with m=1, 2, and 3 that were well below the reported m=7 critical thickness [4]. With nonpolar SrRuO$_3$ electrodes, the paraelectric configuration is energetically more stable than the ferroelectric configuration for all BaTiO$_3$ film thicknesses studied. This is confirmed by the increase in total energy as a function of the polar mode amplitude A$_{BTO}$ (FIG. 7B). Indeed, the use of a centrosymmetric metal for the thinnest ferroelectric film resulted in an antisymmetric poling effect of the two interfaces, which forbid the possibility of a ferroelectric displacement [5].

A computational experiment was then performed whereby centric SrRuO$_3$ was transmuted into a hypothetical polar metal by following the design rules for noncentrosymmetric metals introduced in Ref. 27. This was done by imposing a polar distortion in SrRuO$_3$, which involved only the Sr atoms, as the orbital character at the Fermi level has a negligible contribution from these atoms, with parallel polar displacements at the SrO/TiO$_2$ interfaces as suggested by the LiOsO$_3$/NaNbO$_3$/LiOsO$_3$ capacitor results. Bulk SrRuO$_3$ does not exhibit polar distortions, and here it was made artificially polar to isolate the interfacial geometric effect independent of chemistry with respect to the model with centrosymmetric electrodes.

In FIG. 8A the energy evolution of this hypothetical capacitor as a function of the mode amplitude A$_{BTO}$ is shown, with parallel polar Sr displacements imposed uniformly at 0.07 Å with respect to the centrosymmetric structure (see inset). In contrast to FIG. 7B, the ferroelectric state of BaTiO$_3$ was more stable than the paraelectric geometry for all thicknesses m=1, 2, and 3, as indicated by the energy gain for A$_{BTO}\neq 0$. These results indicate that t$_{FE}$*→0 in the BaTiO$_3$ film between the polar-metal SrRuO$_3$.

The energy gain was strongly influenced by the polar displacements of the Sr atoms. In particular, by doubling the amplitude of the polar displacements of the Sr atoms, from 0.07 Å to 0.14 Å for the case m=1, it was found that the energy gain increased from μ3 meV to ~10 meV (FIG. 8B). Comparing FIGS. 8A and 8B, a shift was found in the critical mode amplitude to larger values, which suggests that the device containing a polar-metal electrode with larger Sr displacements displayed a larger ferroelectric polarization. Indeed, when the other limit was considered by fully removing the polar displacements at the SrO/TiO$_2$ interface (setting them to 0 Å), the energy landscape presented in FIG. 7B was restored. Note that for the disappearance of the critical thickness, it was necessary that the polar direction (or a component of it) in the electrodes, and therefore that of the interfacial dipole, coincided with the direction of polarization of the ferroelectric film (FIG. 8B, inset).

Figure 9:
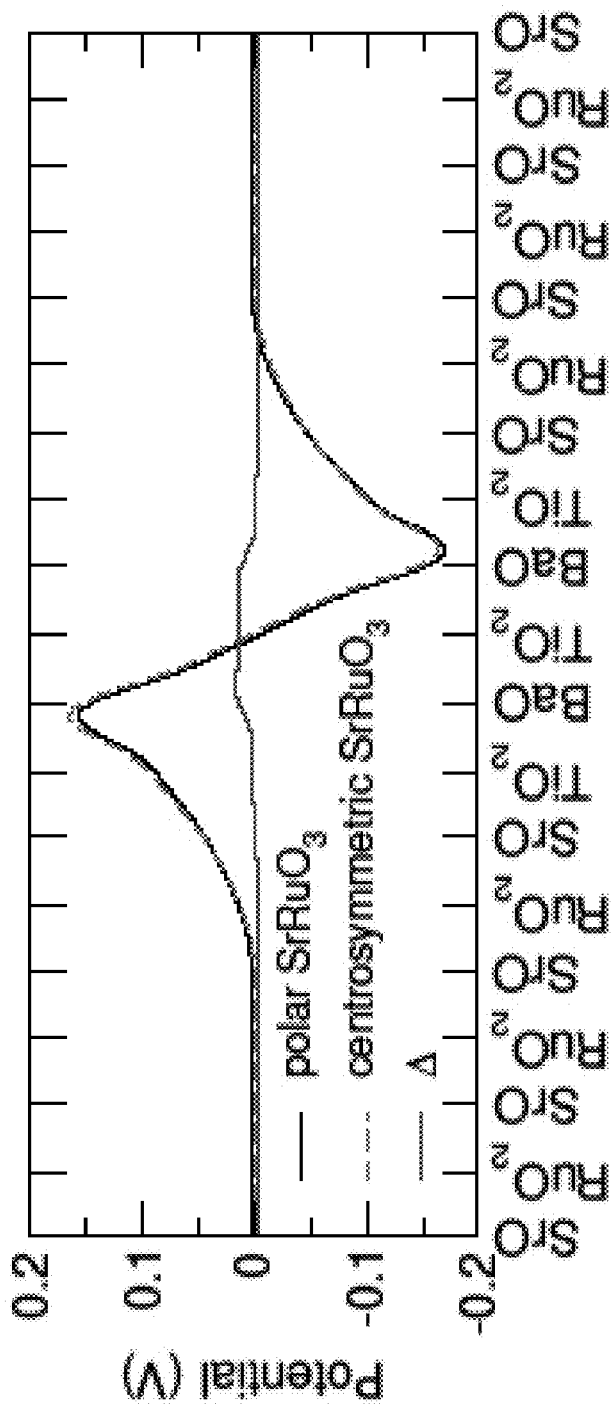
FIG. 9 shows the planar and macroscopically averaged electrostatic potential of the BaTiO$_3$ ferrocapacitor (m=2) along [001] between polar (solid line) and centrosymmetric (broken line) SrRuO$_3$ electrodes. The difference, Δ, is also shown. The amplitude of the polar distortion in the BaTiO$_3$ film is fixed to ~0.6 Å, which corresponds to the minimum in FIG. 8B. The configuration with paraelectric BaTiO$_3$ is used as reference.
Figure 10B:
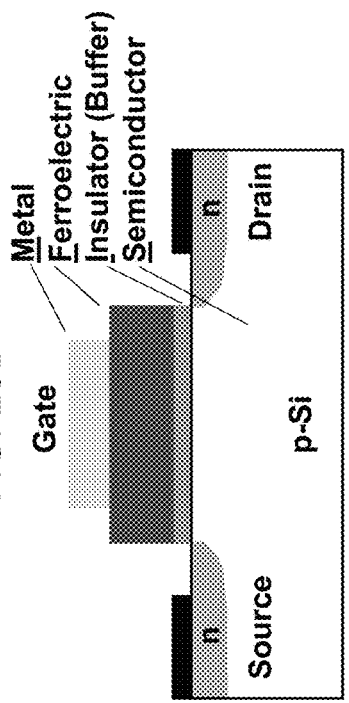
FIGS. 10A-10D show geometries of illustrative ferroelectric field-effect transistors (FE-FETs).
Figure 10D:
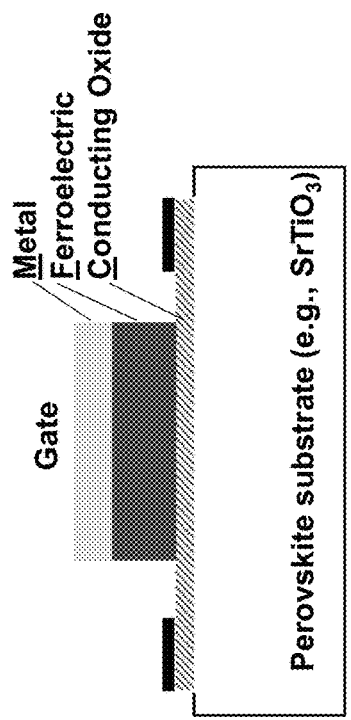
Figure 10A:
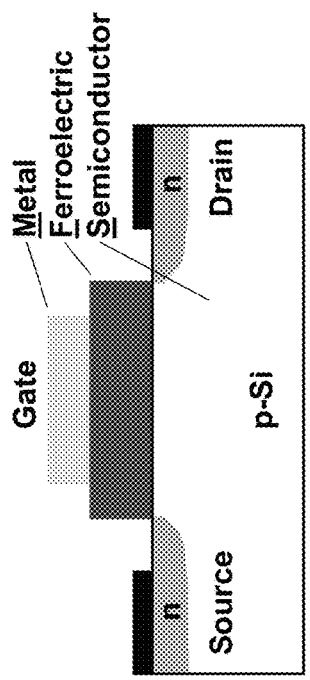
Figure 10C:
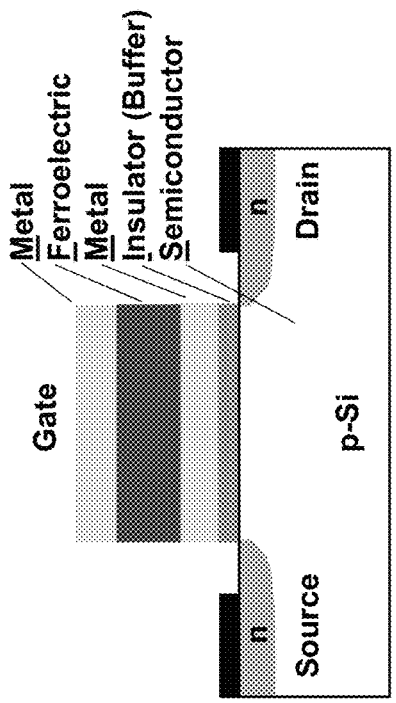

It could be argued that the findings here were a result of the polar metals better screening the ferroelectrics polarization; however, this was not the case. Indeed, the electrostatic for the BaTiO$_3$ nanocapacitor with "polar" and nonpolar SrRuO$_3$ electrodes were almost the same (FIG. 9). Moreover, polar metals typically have longer screening lengths than conventional metals [41]. This result further confirms the role of interfacial geometric effects induced by the polar structure of the metallic electrode in controlling the critical thickness.

Lastly, how the proposed device can be switched is discussed. Polar metals are not ferroelectrics. Indeed, the application of an electric field cannot switch the polar distortion in the metal because the free electrons will screen the electric field. However, it has been shown that the polar distortion in the metal can be switched by applying an electric field to a superlattice composed of an insulating ferroelectric material and a polar metal by coupling to the ferroelectric polarization [42]. Similarly, when an electric field is applied to the aforementioned nanocapacitors, the polar distortion in the ferroelectric thin film should align along the direction of the electric field; then, because of the interfacial coupling between the polar metallic electrode and the ferroelectric film [42], the polar displacements in the polar metal and the interfacial polar displacements should follow. Note that the geometric configuration required to sustain ferroelectricity, i.e., $t_{FE}^* \to 0$, is preserved in the switching mechanism. Alternative approaches have also been applied to degenerately doped ferroelectrics.[43]

CONCLUSION

In summary, a ferroelectric capacitor is proposed wherein the conventional metallic electrodes are replaced by noncentrosymmetric metallic electrodes. It was shown that the polar displacements in the noncentrosymmetric metallic electrodes induced interfacial ferroelectricity, which supported a polar instability in the ferroelectric film regardless of the dielectric thickness. Although $LiOsO_3$ was utilized herein for simplicity, these results are general and the same conclusions may be achieved using other noncentrosymmetric metals as electrodes with the described geometric constraints (see Ref. 44 for a list of materials). These polar-metal based nanoscale capacitors maintain the functionality of the ferroelectric film independent of the degree of miniaturization and lead to device architectures with improved scalability.

REFERENCES

[1] H. Ishiwara, M. Okuyama, and Y. Arimoto, *Ferroelectric Random Access Memories: Fundamentals and Applications* (Springer, Berlin, Germany, 2004).
[2] G. Muller, N. Nagel, C. U. Pinnow, and T. Rohr, "Emerging non-volatile memory technologies," in *Solid-State Circuits Conference, 2003. ESSCIRC '03. Proceedings of the 29th European* (2003) pp. 37-44.
[3] J. F. Scott, "Future issues in ferroelectric miniaturization," Ferroelectrics 206, 365-379 (1998), http://dx.doi.org/10.1080/00150199808009170.
[4] Javier Junquera and Philippe Ghosez, "Critical thickness for ferroelectricity in perovskite ultrathin films," Nature 422, 506-509 (2003).
[5] G. Gerra, A. K. Tagantsev, N. Setter, and K. Parlinski, "Ionic polarizability of conductive metal oxides and critical thickness for ferroelectricity in $BaTiO_3$," Phys. Rev. Lett. 96, 107603 (2006).
[6] G. Gerra, A. K. Tagantsev, N. Setter, and K. Parlinski, "Erratum: Ionic polarizability of conductive metal oxides and critical thickness for ferroelectricity in $batio_3$ [phys. rev. lett. 96, 107603 (2006)]," Phys. Rev. Lett., 169904 (2007).
[7] Kenji Ishikawa, Takashi Nomura, Nagaya Okada, and Kazumasa Takada, "Size effect on the phase transition in p b t i o 3 fine particles," Japanese Journal of Applied Physics 35, 5196 (1996).
[8] T. Tybell, C. H. Ahn, and J.-M. Triscone, "Ferroelectricity in thin perovskite films," Applied Physics Letters 75, 856-858 (1999).
[9] B. Jiang, J. L. Peng, L. A. Bursill, and W. L. Zhong, "Size effects on ferroelectricity of ultrafine particles of pbtio3," Journal of Applied Physics 87, 3462-3467 (2000).
[10] Ph. Ghosez and K. M. Rabe, "Microscopic model of ferroelectricity in stress-free pbtio3 ultrathin films," Applied Physics Letters 76, 2767-2769 (2000).
[11] B. Meyer and David Vanderbilt, "Ab initio study of $batio_3$ and $pbtio_3$ surfaces in external electric fields," Phys. Rev. B 63, 205426 (2001).
[12] Igor Kornev, Huaxiang Fu, and L. Bellaiche, "Ultrathin films of ferroelectric solid solutions under a residual depolarizing field," Phys. Rev. Lett. 93, 196104 (2004).
[13] R. Ramesh and D. G. Schlom, "MATERIALS SCIENCE: Orienting Ferroelectric Films," Science 296, 1975-1976 (2002).
[14] L. Despont, C. Koitzsch, F. Clerc, M. G. Garnier, P. Aebi, C. Lichtensteiger, J.-M. Triscone, F. J. Garcia de Abajo, E. Bousquet, and Ph. Ghosez, "Direct evidence for ferroelectric polar distortion in ultrathin lead titanate perovskite films," Phys. Rev. B 73, 094110 (2006).
[15] Yajun Zhang, Gui-Ping Li, Takahiro Shimada, Jie Wang, and Takayuki Kitamura, "Disappearance of ferroelectric critical thickness in epitaxial ultrathin $BaZro_3$ films," Phys. Rev. B 90, 184107 (2014).
[16] John Hirth, *Dislocations in Solids* (Elsevier, 2008).
[17] Kevin F. Garrity, Karin M. Rabe, and David Vanderbilt, "Hyperferroelectrics: Proper ferroelectrics with persistent polarization," Phys. Rev. Lett. 112, 127601 (2014).
[18] Massimiliano Stengel, Craig J. Fennie, and Philippe Ghosez, "Electrical properties of improper ferroelectrics from first principles," Phys. Rev. B 86, 094112 (2012).
[19] Na Sai, Craig J. Fennie, and Alexander A. Demkov, "Absence of critical thickness in an ultrathin improper ferroelectric film," Phys. Rev. Lett. 102, 107601 (2009).
[20] Joseph W. Bennett, Kevin F. Garrity, Karin M. Rabe, and David Vanderbilt, "Hexagonal abc semiconductors as ferroelectrics," Phys. Rev. Lett. 109, 167602 (2012).
[21] M. Stengel and N. A. Spaldin, "Origin of the dielectric dead layer in nanoscale capacitors," Nature 443, 679-682 (2006).
[22] Massimiliano Stengel, David Vanderbilt, and Nicola A. Spaldin, "Enhancement of ferroelectricity at metal-oxide interfaces," Nature Materials 8, 392-397 (2009).
[23] Meng-Qiu Cai, Yue Zheng, Pui-Wai Ma, and C. H. Woo, "Vanishing critical thickness in asymmetric ferroelectric tunnel junctions: First principle simulations," Journal of Applied Physics 109, 024103 (2011).
[24] Hiroyuki Yamada, Atsushi Tsurumaki-Fukuchi, Masaki Kobayashi, Takuro Nagai, Yoshikiyo Toyosaki, Hiroshi Kumigashira, and Akihito Sawa, "Strong Surface-Termination Effect on Electroresistance in Ferroelectric Tunnel Junctions," Advanced Functional Materials 25, 2708-2714 (2015).
[25] Youguo Shi, Yanfeng Guo, Xia Wang, Andrew J. Princep, Dmitry Khalyavin, Pascal Manuel, Yuichi Michiue, Akira Sato, Kenji Tsuda, Shan Yu, Masao Arai, Yuichi Shirako, Masaki Akaogi, Nanlin Wang, Kazunari Yamaura, and Andrew T. Boothroyd, "A ferroelectric-like structural transition in a metal," Nature Materials 12, 1024 (2013).
[26] T. H. Kim, D. Puggioni, Y. Yuan, H. Zhou L. Xie, N. Campbell, P. J. Ryan, Y. Choi, J.-W. Kim, J. R. Patzner, S. Ryu, J. P. Podkaminer, J. Irwin, Y. Ma, C. J. Fennie, M. S. Rzchowski, V. Gopalan X. Q. Pan, J. M. Rondinelli, and C. B. Eom, "Polar metals by geometric design," Nature 533, 68-72 (2016).
[27] Danilo Puggioni and James M. Rondinelli, "Designing a robustly metallic noncentrosymmetric ruthenate oxide with large thermopower anisotropy," Nat. Commun. 5, 3432(2013).
[28] Jochen Heyd, Gustavo E. Scuseria, and Matthias Ernzerhof, "Hybrid functionals based on a screened coulomb potential," J. Chem. Phys. 118, 8207-8215 (2003).
[29] Jochen Heyd, Gustavo E. Scuseria, and Matthias Ernzerhof, "Erratum: hybrid functionals based on a screened coulomb potential [j. chem. phys. 118, 8207 (2003)]," J. Chem. Phys. 124, 219906 (2006).

[30] G. Kresse and J. Furthmüller, "Efficiency of ab-initio total energy calculations for metals and semiconductors using a plane-wave basis set," Computational Materials Science 6, 15-50 (1996).

[31] Peter E. Blöchl, O. Jepsen, and O. K. Andersen, "Improved tetrahedron method for brillouin-zone integrations," Physical Review B 49, 16223-16233 (1994).

[32] Hendrik J. Monkhorst and James D. Pack, "Special points for Brillouin-zone integrations," Physical Review B 13, 5188-5192 (1976).

[33] Seidel P. and Hoffmann W, "Verfeinerung der kristallstruktur von $NaNbO_3$," Zeitschrift fur Kristallo-graphie 143, 444-459 (1976).

[34] J. Liu, M. Kargarian, M. Kareev, B. Gray, Phil J. Ryan, A. Cruz, N. Tahir, Yi-De Chuang, J. Guo, James M. Rondinelli, John W. Freeland, Gregory A. Fiete, and J. Chakhalian, "Heterointerface engineered electronic and magnetic phases of $NdNiO_3$ thin films," Nat. Commun. 4, 3714 (2013).

[35] Branton J. Campbell, Harold T. Stokes, David E. Tanner, and Dorian M. Hatch, "ISODISPLACE: a web-based tool for exploring structural distortions," Journal of Applied Crystallography 39, 607-614 (2006).

[36] Gianluca Giovannetti and Massimo Capone, "Dual nature of the ferroelectric and metallic state in $lioso_3$," Phys. Rev. B 90, 195113 (2014).

[37] W. Zhong, R. D. King-Smith, and David Vanderbilt, "Giant lo-to splittings in perovskite ferroelectrics," Phys. Rev. Lett. 72, 3618-3621 (1994).

[38] S. K. Mishra, N. Choudhury, S. L. Chaplot, P. S. R. Krishna, and R. Mittal, "Competing antiferroelectric and ferroelectric interactions in $NaNbo_3$: Neutron diffraction and theoretical studies," Phys. Rev. B 76, 024110 (2007).

[39] John P. Perdew, "Density functional theory and the band gap problem," International Journal of Quantum Chemistry 28, 497-523 (1985).

[40] Massimiliano Stengel, Pablo Aguado-Puente, Nicola A. Spaldin, and Javier Junquera, "Band alignment at metal/ferroelectric interfaces: Insights and artifacts from first principles," Phys. Rev. B 83, 235112 (2011).

[41] Gianluca Giovannetti, Danilo Puggioni, James M. Rondinelli, and Massimo Capone, "Interplay between electron correlations and polar displacements in metallic $SrEuMo_2O_6$," Phys. Rev. B 93, 115147 (2016).

[42] H. J. Xiang, "Origin of polar distortion in $LiNbO_3$-type "ferroelectric" metals:Role of A-site instability and short-range interactions," Phys. Rev. B 90, 094108 (2014).

[43] Pavan Nukala, Mingliang Ren, Rahul Agarwal, Jacob Berger, Genii Liu, A. T. Charlie Johnson, and Ritesh Agarwal, "Inverting polar domains via electrical pulsing in metallic germanium telluride," Nat. Commun. 8, 15033 (2017).

[44] Nicole A. Benedek and Turan Birol, "'ferroelectric' metals reexamined: fundamental mechanisms and design considerations for new materials," J. Mater. Chem. C 4, 4000-4015 (2016).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

Use of directional terms such as "under" and "over" is not meant to be limiting, but rather to establish relative relationships between elements and points of reference.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A ferroelectric heterostructure comprising a ferroelectric layer comprising a ferroelectric material and a first electrode layer comprising a first noncentrosymmetric metal, the first electrode layer disposed on the ferroelectric layer to form a ferroelectric-first electrode interface, wherein the ferroelectric layer is characterized by exhibiting an electric polarization and the first electrode layer is characterized by exhibiting polar ionic displacements and further wherein, a component of the polar ionic displacements of the first electrode layer is parallel to a component of the electric polarization of the ferroelectric layer.

2. The heterostructure of claim 1, wherein the ferroelectric material is a ferroelectric oxide.

3. The heterostructure of claim 2, wherein the ferroelectric oxide is selected from $SrBi_2Ta_2O_9$; $Bi_4Ti_3O_{12}$; $PbZr_{1-x}Ti_xO_3$ (0≤x≤1), $BaTiO_3$, $BiFeO_3$, and combinations thereof.

4. The heterostructure of claim 1, wherein the ferroelectric material is selected from $BaTiO_3$; strained $SrTiO_3$; $Ba_xSr_{1-x}TiO_3$ wherein 1>x>0; $Bi_4Ti_3O_{12}$; $PbTiO_3$; $BaZrO_3$; $Pb(Zr_xTi_{1-x})O_3$ wherein 1≥x≥0; $(Sr,Ba)Nb_2O_6$; $NaNbO_3$; $BiFeO_3$; $YMnO_3$; $Sr_xCa_{3-x}Ti_2O_7$ wherein 1>x>0; $SrBi_2Ta_2O_9$; $LiNbO_3$; $Sr(Ta,Nb)_2O_7$; $Gd_2(MoO_4)_3$; $Pb_5Ge_3O_{11}$; $BaMnF_4$; GeTe; $SrAlF_5$; SbSI; and combinations thereof.

5. The heterostructure of claim 1, wherein the ferroelectric layer is substantially strain free.

6. The heterostructure of claim 1, wherein the first noncentrosymmetric metal is selected from $Rh_2Ga_9$; $Ru_7B_3$; BiPd; UIr; $Mg_2Al_3$; $Ir_9Al_{28}$; $Ir_2Ga_9$; $Rh_2Ga_9$; $\gamma$-$Bi_2Pt$; $Au_{6.05}Zn_{12.51}$; $Ba_{21}Al_{40}$; $Cr_5Al_8$; $Mn_5Al_8$; $Cu_{7.8}Al_5$; $Cu_7Hg_6$; $NbS_2$; $Sn_4As_3$; $Sn_4P_3$; $REPt_3B$, wherein RE is selected from La, Pr, and Nd; $La_5B_2C_6$; $LaNiC_2$; $La_2NiAl_7$; CaAlSi; $Li_2IrSi_3$; $CeRuSi_3$; $SrAuSi_3$; $CePt_3Si$; $AIrSi_3$, wherein A is selected from Ca and Ce; $ARhSi_3$, wherein A is selected from Ce and La; $APtSi_3$, wherein A is selected from Ca, Ba, and Eu; $ACoGe_3$, wherein A is selected from Ce, Pr, and La; $LaASi_3$, wherein A is selected from Ir and Pd; $CeAGe_3$, wherein A is selected from Ir and Rh; $EuNiGe_3$; $EuPdGe_3$; $LaAGe_3$, wherein A is selected from Co, Fe, Ir and Rh; $SrAGe_3$, wherein A is selected from Pd and Pt; $REPdIn_2$, wherein RE is selected from Ce, Pr, Nd, Sm, Gd, Tb, Dy, Ho, Er, Tm, Lu and Y; REAuGe, wherein RE is selected from Ce, Lu, Sc and Ho; $La_{15}Ge_9X$, wherein X is selected from C, Co, Fe, and Ni; HoAuGe; CeCuSn; $Sr_3Cu_8Sn_4$; $Li_{17}Ag_3Sn_6$; $LiOsO_3$; $Ca_3Ru_3O_7$; $RESr_2Cu_2GaO_7$, wherein RE is any of La through Yb or Y; $BaVS_3$; $AV_6S_8$, wherein A is selected from K, Rb, Cs, and Tl; $La_4Mg_5Ge_6$; $La_4Mg_7Ge_6$; $Yb_2Ga_4Ge_6$; ErPdBi; LuPtBi;

$Ce_2Rh_3(Pb, Bi)_5$; $Eu_2Pt_3Sn_5$; $Lu_4Zn_5Ge_6$; $IrMg_{2.03}In_{0.97}$; $IrMg_{2.20}In_{0.80}$; CeAuSn; $LaGeSi_3$; and combinations thereof.

7. The heterostructure of claim 1, wherein the first noncentrosymmetric metal is selected from $Ca_3Ru_2O_7$, CeCuSn, CeAuSn, $CaIrSi_3$, $CaPtSi_3$, $LaIrSi_3$, $LaGeSi_3$, $LiOsO_3$ and combinations thereof.

8. The heterostructure of claim 7, wherein the ferroelectric material is a ferroelectric oxide.

9. The heterostructure of claim 8, wherein the ferroelectric oxide is selected from $SrBi_2Ta_2O_9$, $Bi_4Ti_3O_{12}$, $PbZr_{1-x}Ti_xO_3$ ($0 \le x \le 1$), $BaTiO_3$, $BiFeO_3$, and combinations thereof.

10. The heterostructure of claim 9, wherein the ferroelectric oxide is $BaTiO_3$ and the first noncentrosymmetric metal is $LiOsO_3$.

11. The heterostructure of claim 1, further comprising a second electrode layer comprising a second noncentrosymmetric metal, wherein the ferroelectric layer is between the first and second electrode layers to further form a ferroelectric-second electrode interface, wherein the second electrode layer is characterized by exhibiting polar ionic displacements and further wherein, a component of the polar ionic displacements of the second electrode layer is parallel to the component of the electric polarization of the ferroelectric layer.

12. The heterostructure of claim 11, wherein the first and second noncentrosymmetric metals are the same such that the heterostructure is a symmetric heterostructure.

13. The heterostructure of claim 1, wherein the ferroelectric layer is has an average thickness which is less than a critical thickness value of the ferroelectric layer.

14. The heterostructure of claim 13, wherein the average thickness is in the range of from about the thickness of a single unit cell of the ferroelectric material to less than the critical thickness value.

15. A field-effect transistor comprising the heterostructure of claim 1 disposed over a substrate, a source electrically coupled to the substrate and a drain electrically coupled to the substrate.

16. The transistor of claim 15, further comprising a buffer layer between the heterostructure and the substrate.

17. A field-effect transistor comprising the heterostructure of claim 11 disposed over a substrate, a source electrically coupled to the substrate and a drain electrically coupled to the substrate.

18. The transistor of claim 17, further comprising a buffer layer between the heterostructure and the substrate.

19. The transistor of claim 17, wherein the substrate is a perovskite substrate.

20. A method of using the heterostructure of claim 1, the method comprising applying an electric field across the heterostructure.

* * * * *